United States Patent
Mandal et al.

(10) Patent No.: US 10,013,519 B2
(45) Date of Patent: Jul. 3, 2018

(54) PERFORMANCE MATCHING IN THREE-DIMENSIONAL (3D) INTEGRATED CIRCUIT (IC) USING BACK-BIAS COMPENSATION

(71) Applicant: GLOBALFOUNDRIES INC., Grand Cayman (KY)

(72) Inventors: Sudeep Mandal, Bangalore (IN); Jeanne P. Bickford, Essex Junction, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 57 days.

(21) Appl. No.: 15/270,598

(22) Filed: Sep. 20, 2016

(65) Prior Publication Data

US 2018/0082007 A1    Mar. 22, 2018

(51) Int. Cl.
G06F 17/50    (2006.01)
(52) U.S. Cl.
CPC ................... G06F 17/5072 (2013.01)
(58) Field of Classification Search
CPC .................................................. G06F 17/5072
See application file for complete search history.

(56) References Cited

U.S. PATENT DOCUMENTS

| 8,781,792 B2 | 7/2014 | Visweswariah et al. |
| 9,711,407 B2* | 7/2017 | Or-Bach ............. G06F 17/5072 |
| 2009/0194768 A1* | 8/2009 | Leedy ....................... B81B 7/02 |
| | | 257/48 |

* cited by examiner

*Primary Examiner* — Stacy Whitmore
(74) *Attorney, Agent, or Firm* — David Cain; Hoffman Warnick LLC

(57) ABSTRACT

Various embodiments include approaches for designing three-dimensional (3D) integrated circuits (ICs). In one embodiment, a system is configured to: read an electronic chip identification (ECID) for a plurality of dies formed from distinct wafer lots, the ECID indicating a process performance parameter for each distinct wafer lot; create a reference table mapping a back-bias voltage to be applied to each die to the process performance parameter for each distinct wafer lot; determine performance requirements of a customer design for the 3D IC structure; assemble the design of the 3D IC structure including a set of dies selected from at least two of the distinct wafer lots; and assign a back bias voltage to each die based upon the performance requirements of the customer design and the reference table.

20 Claims, 4 Drawing Sheets

PERFORMANCE MATCHING IN THREE-DIMENSIONAL (3D) INTEGRATED CIRCUIT (IC) USING BACK-BIAS COMPENSATION

FIELD

The subject matter disclosed herein relates to integrated circuits. More particularly, the subject matter disclosed herein relates to approaches for forming three-dimensional (3D) integrated circuit devices.

BACKGROUND

Fully depleted silicon-on-insulator (FDSOI) technology is a planar process technology that relies on two primary features. First, an ultra-thin layer of insulator, called the buried oxide, is positioned on top of the base silicon. Then, a thin silicon film implements the transistor channel. Due to the thinness of the silicon, there is no need to dope the channel, therefore making the transistor fully depleted. FDSOI enables significant improvement in transistor electrostatic characteristics versus conventional bulk technology. For example, the buried oxide layer lowers the parasitic capacitance between the source and the drain. Further, when compared with conventional bulk technology, FDSOI also efficiently confines the electrons flowing from the source to the drain, dramatically reducing performance-degrading leakage currents.

Three-dimensional (3D) integrated circuit (IC) devices utilize stacked wafers and/or dies that are vertically interconnected using through-silicon vias (TSVs), so that the wafers or dies perform as a single device. 3D ICs can provide enhanced performance, with reduced power usage (and a smaller footprint) than conventional two-dimensional IC devices.

Capitalizing on both technological advancements is the deployment of FDSOI dies in 3D IC devices. These 3D FDSOI devices include stacked FDSOI dies formed from distinct FDSOI wafers (or, wafer lots). However, because these dies are sourced from different wafers (or wafer lots), these dies commonly have different process performance distributions (e.g., fast, slow, nominal) tailored to the particular devices for which such wafers are formed. This performance "mismatch" can make it difficult to construct a 3D FDSOI device to meet performance requirements while maintaining a desirable yield in the wafers.

BRIEF DESCRIPTION

Various embodiments of the disclosure include approaches for designing three-dimensional (3D) integrated circuits (ICs). In one embodiment, a system disclosed has: at least one computing device configured to design a three-dimensional (3D) integrated circuit (IC) structure by performing actions including: read an electronic chip identification (ECID) for each of a plurality of dies formed from a plurality of distinct wafer lots, the ECID indicating a process performance parameter for each of the plurality of distinct wafer lots; create a reference table mapping a back-bias voltage to be applied to each of the plurality of dies to the process performance parameter for each of the plurality of distinct wafer lots; determine performance requirements of a customer design for the 3D IC structure; assemble the design of the 3D IC structure including a set of dies selected from at least two of the plurality of distinct wafer lots; and assign a back bias voltage to each die in the set of dies based upon the performance requirements of the customer design and the reference table indicating the process performance parameter for the die.

A first aspect of the disclosure includes a system having: at least one computing device configured to design a three-dimensional (3D) integrated circuit (IC) structure by performing actions including: read an electronic chip identification (ECID) for each of a plurality of dies formed from a plurality of distinct wafer lots, the ECID indicating a process performance parameter for each of the plurality of distinct wafer lots; create a reference table mapping a back-bias voltage to be applied to each of the plurality of dies to the process performance parameter for each of the plurality of distinct wafer lots; determine performance requirements of a customer design for the 3D IC structure; assemble the design of the 3D IC structure including a set of dies selected from at least two of the plurality of distinct wafer lots; and assign a back bias voltage to each die in the set of dies based upon the performance requirements of the customer design and the reference table indicating the process performance parameter for the die.

A second aspect of the disclosure includes a computer program product having program code stored on a computer-readable storage medium, which when executed by at least one computing device, causes the at least one computing device to design a three-dimensional (3D) integrated circuit (IC) structure by performing actions including: read an electronic chip identification (ECID) for each of a plurality of dies formed from a plurality of distinct wafer lots, the ECID indicating a process performance parameter for each of the plurality of distinct wafer lots; create a reference table mapping a back-bias voltage to be applied to each of the plurality of dies to the process performance parameter for each of the plurality of distinct wafer lots; determine performance requirements of a customer design for the 3D IC structure; assemble the design of the 3D IC structure including a set of dies selected from at least two of the plurality of distinct wafer lots; and assign a back bias voltage to each die in the set of dies based upon the performance requirements of the customer design and the reference table indicating the process performance parameter for the die.

A third aspect of the disclosure includes a computer-implemented method of designing a three-dimensional (3D) integrated circuit (IC) structure, performed on at least one computing device, the method including: reading an electronic chip identification (ECID) for each of a plurality of dies formed from a plurality of distinct wafer lots, the ECID indicating a process performance parameter for each of the plurality of distinct wafer lots; creating a reference table mapping a back-bias voltage to be applied to each of the plurality of dies to the process performance parameter for each of the plurality of distinct wafer lots; determining performance requirements of a customer design for the 3D IC structure; assembling the design of the 3D IC structure including a set of dies selected from at least two of the plurality of distinct wafer lots; and assigning a back bias voltage to each die in the set of dies based upon the performance requirements of the customer design and the reference table indicating the process performance parameter for the die.

BRIEF DESCRIPTION OF THE FIGURES

These and other features of this invention will be more readily understood from the following detailed description of the various aspects of the invention taken in conjunction with the accompanying drawings that depict various embodiments of the invention, in which.

Figure 1:
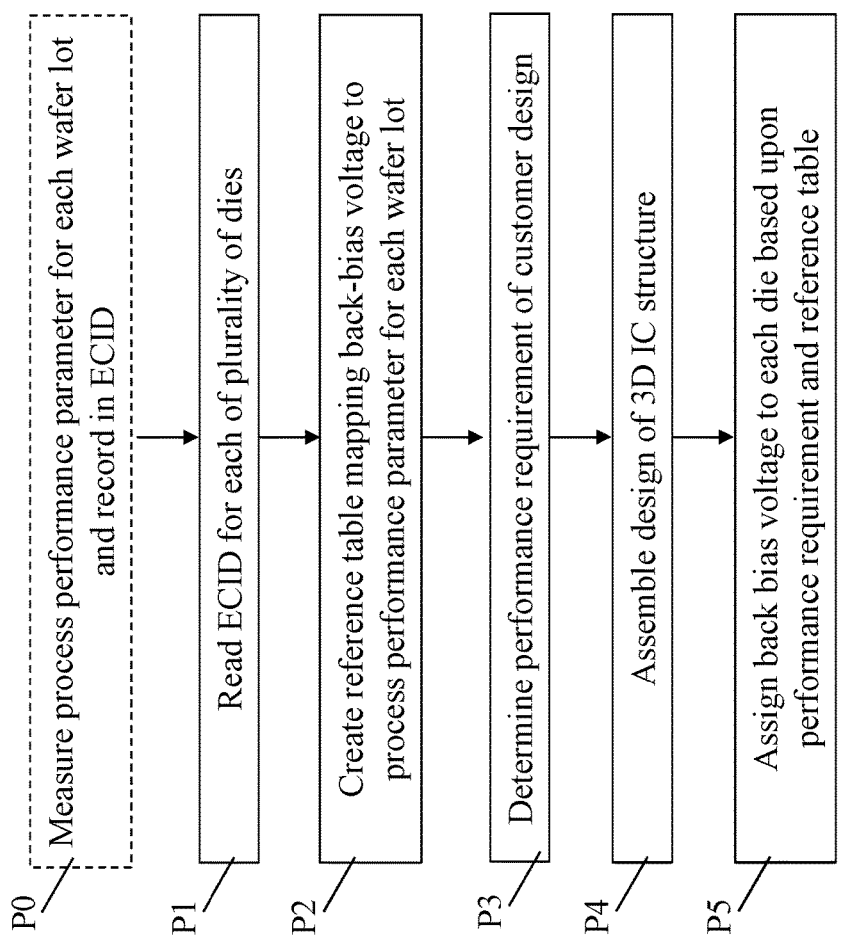
FIG. 1 shows a flow diagram illustrating a method performed according to various embodiments of the disclosure.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As indicated above, the subject matter disclosed herein relates to integrated circuits (ICs). More particularly, the subject matter disclosed herein relates to approaches for forming three-dimensional (3D) IC devices.

In contrast to conventional approaches, various embodiments of the disclosure include approaches for designing 3D IC structures with performance-tailored back-bias voltages for each of a plurality of dies. These approaches include designing and assembling (e.g., modeling) 3D IC structures with dies from distinct wafer lots, which have distinct process performance parameters. With tailored back-bias voltages, the 3D IC structures can meet customer requirements despite having components (dies) with disparate process performance parameters.

In the following description, reference is made to the accompanying drawings that form a part thereof, and in which is shown by way of illustration specific example embodiments in which the present teachings may be practiced. These embodiments are described in sufficient detail to enable those skilled in the art to practice the present teachings and it is to be understood that other embodiments may be utilized and that changes may be made without departing from the scope of the present teachings.

Figure 3:
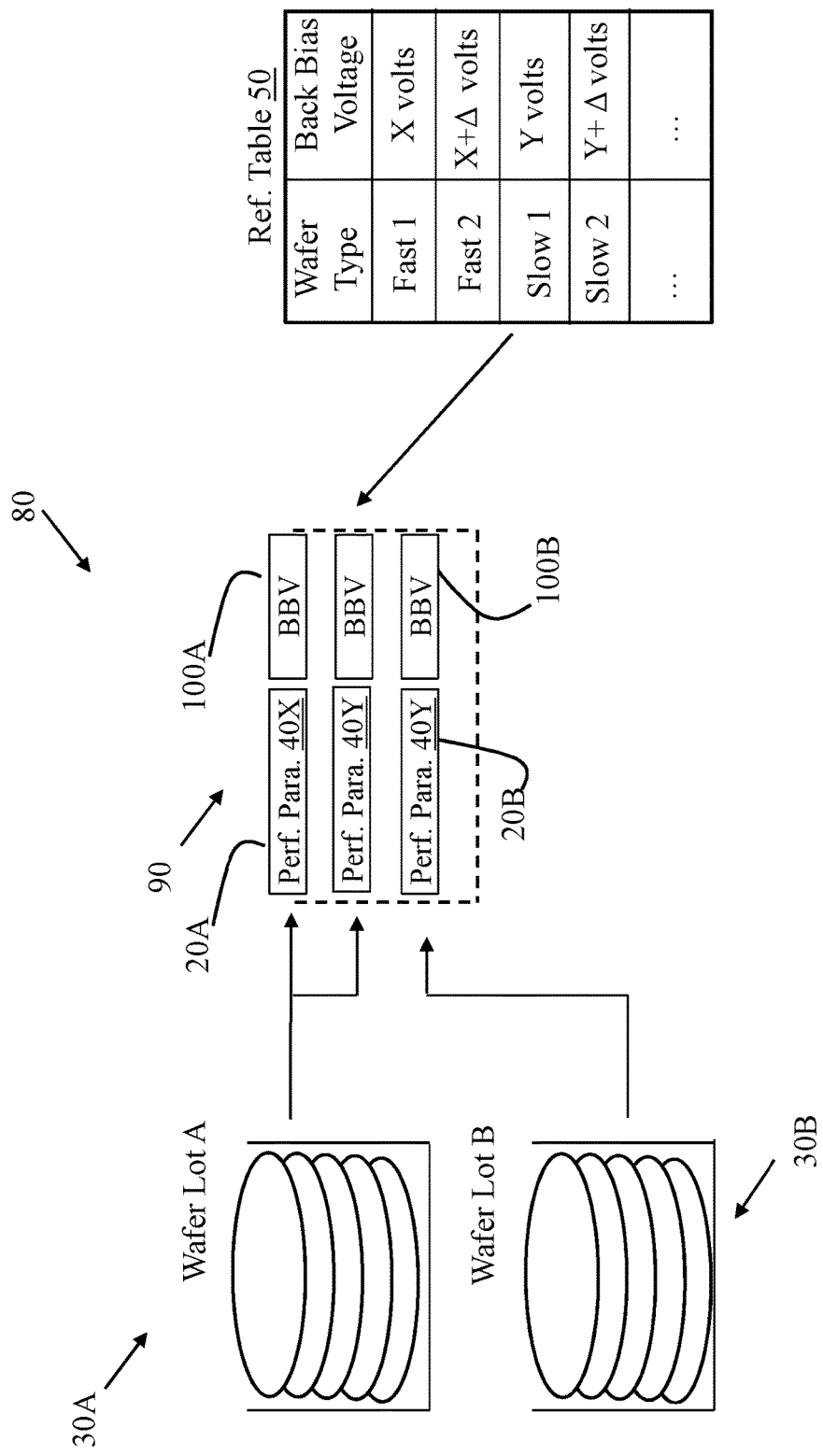
FIG. 3 shows an example data flow diagram illustrating processes in designing a 3D IC according to various embodiments of the disclosure.

FIG. 1 shows a flow diagram illustrating processes according to various embodiments of the disclosure. A 3D IC design system 28 (FIG. 2) can perform various processes as described herein to design a 3D IC (or, 3D IC layout). These processes are described in conjunction with 3D IC design system 28 and related data in FIG. 2, as well as the schematic data flow depiction in FIG. 3 and the schematic depiction of a 3D IC layout in FIG. 4. Turning to FIG. 1, processes according to various embodiments can include:

Process P1: read an electronic chip identification (ECID) 10 for each of a plurality of dies 20 formed from a plurality of distinct wafer lots 30A, 30B, 30C, etc. Wafer lots 30A, 30B, 30C, etc. include wafers formed with process performance parameters 40 (FIG. 3), including particular performance characteristics (e.g., switching, current leakage control, maximum voltage etc.) or device uses (e.g., memory, logic, etc.). As is known in the art, these wafers in each lot 30A, 30B, 30C, are divided into dies 20 that are subsequently used to form integrated circuit devices, e.g., a 3D IC device. In many cases, each die 20 is assigned an ECID 10 that includes the process performance parameters 40 for that die 20. That is, the ECID 10 indicates a process performance parameter 40 for each of the plurality of distinct wafer lots 30A, 30B, 30C, from which the die(s) 20 are formed. Die(s) 20 from distinct wafer lots 30A, 30B, 30C will have distinct ECIDs 10. FIG. 3 illustrates two distinct wafer lots 30A, 30B, used to source an assembled design 90, which is further discussed herein. In various embodiments, the plurality of dies 20 are each formed on fully depleted silicon-on-insulator (FDSOI) substrates.

Process P2: create a reference table 50 (FIGS. 2, 3) mapping a back-bias voltage 100A, 100B, 100C, etc. to be applied to each of the plurality of dies 20 to the process performance parameter 40 for each of the plurality of distinct wafer lots 30A, 30B, 30C. FIG. 3 shows a schematic example of a reference table 50, simply for illustrative purposes, that includes a first data category (e.g., column, row, etc.) assigned to a wafer type (e.g., wafer lot 30A, 30B, 30C), and a second data category assigned to a back bias voltage 100A, 100B, 100C. This example reference table 50 is only one of many different forms of reference table which may be utilized according to various embodiments of the disclosure. It is understood that reference table 50 can take the form of any data correlation device that maps wafer types (e.g., wafer lot 30A, 30B, 30C) to a back bias voltage 100A, 100B, 100C based upon the process performance parameter 40. It is understood that according to various embodiments, reference table 50 may be stored locally at 3D IC design system 28, or can be stored or otherwise retained at any number of distinct locations accessible to 3D IC design system 28, e.g., any external computing device or data storage device, or other distributed forms of such devices.

Figure 2:
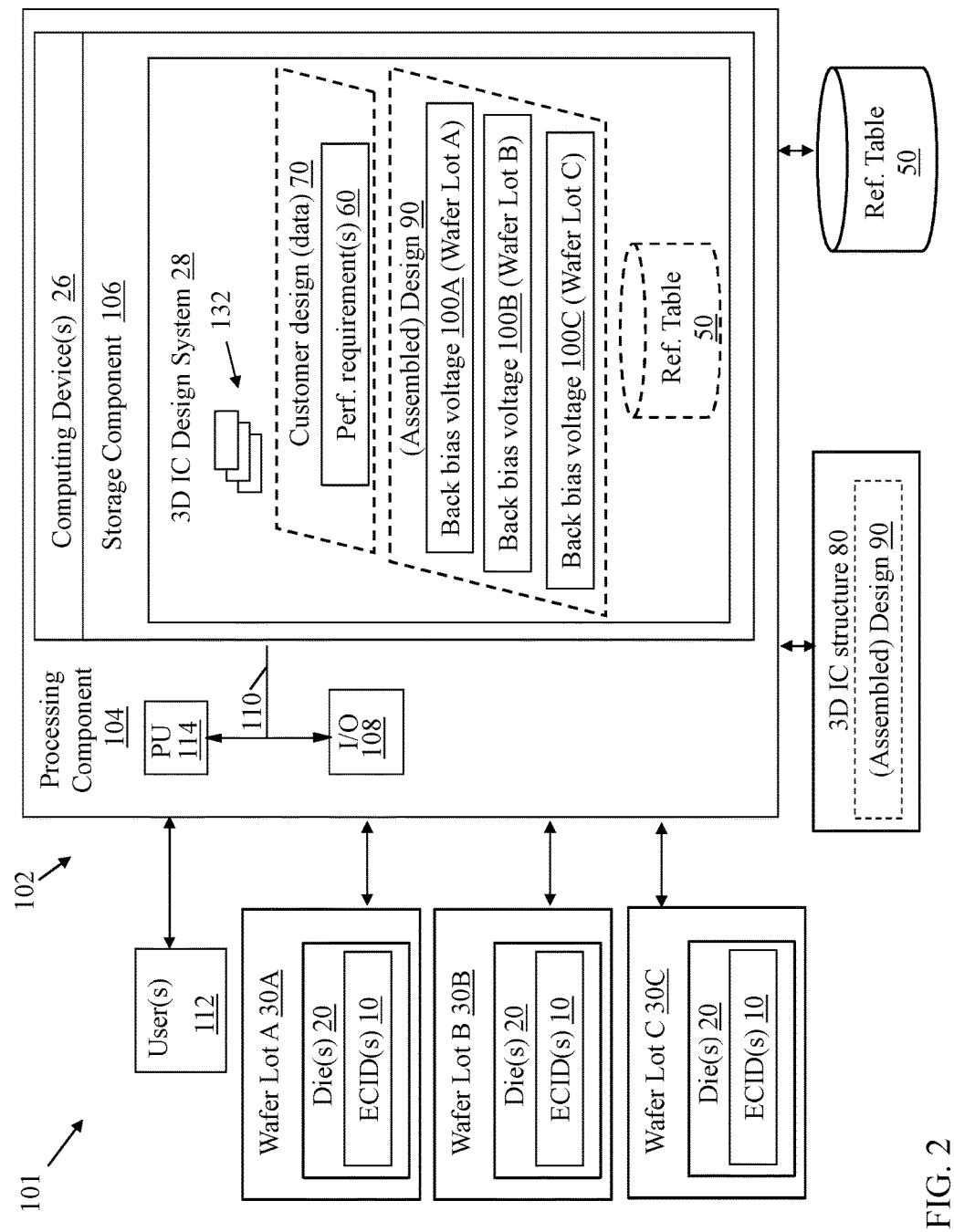
FIG. 2 shows an environment including a system for designing a three-dimensional (3D) integrated circuit (IC), according to various embodiments of the disclosure.
Figure 4:
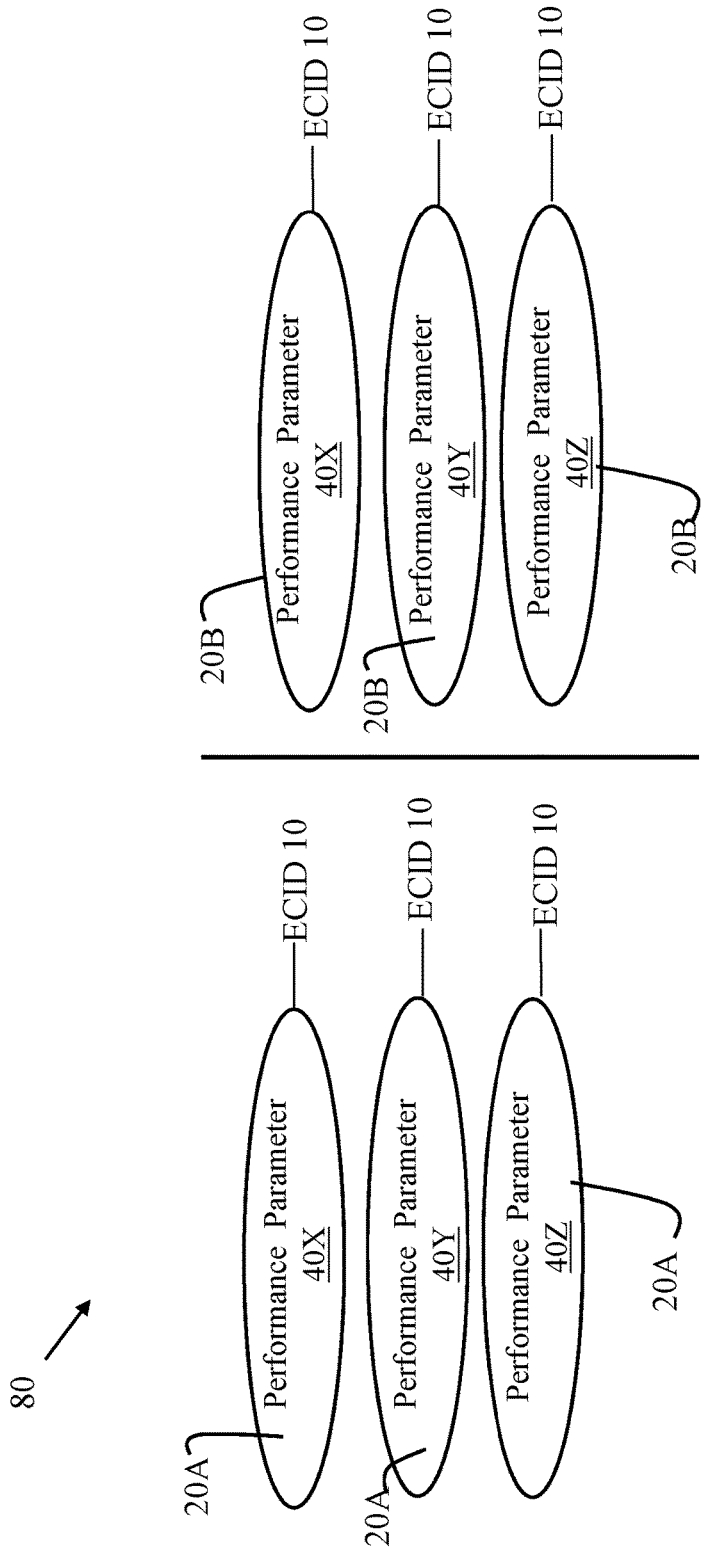
FIG. 4 shows a schematic data depiction of a 3D IC formed according to various embodiments of the disclosure.

Process P3: determine performance requirements 60 of a customer design 70 for a 3D IC structure 80 (FIGS. 2, 3, 4). In various embodiments, this process can include obtaining performance requirement (data) 60 about a customer's design 70, including data about performance requirements such as a processing speed (e.g., switching speed) of 3D IC structure 80, a voltage of 3D IC structure 80, an operating temperature of 3D IC structure 80, a frequency (operating frequency) of 3D IC structure 80 or a nominal current leakage of 3D IC structure 80. It is understood that 3D IC structure 80 can represent any of a number of 3D IC devices, and that reference to a single 3D IC is intended merely for simplicity of explanation. It is understood that customer design (data) 70 can further include additional information about 3D IC structure 80, such as information about physical relationships of components in 3D IC structure 80, e.g., a number of levels within 3D IC structure 80; thicknesses, positions, lengths, etc., of lines, vias, interconnects, gate regions, etc. within one or more levels (e.g., dies 20) of 3D IC structure 80; material types of one or more components within 3D IC structure 80; etc.

Process P4: assemble the design 90 (FIG. 3) of 3D IC structure 80 including a set of dies 20 selected from at least two of the plurality of distinct wafer lots 30A, 30B, 30C, etc. This process can include selecting dies 20 from distinct wafer lots 30A, 30B, 30C, e.g., where 3D IC structure 80 has at least two dies 20 selected from distinct wafer lots 30A, 30B, 30C, etc. In various embodiments, any die 20 that passes testing can be selected. It is understood that selecting dies 20 can include testing those dies 20 for performance and reliability, according to conventional approaches, but may not require pre-sorting of dies 20 based upon voltage characteristics, as the back-bias voltage will be used to modify the performance of the selected die(s) 20, according to various embodiments. These distinct dies 20 can have distinct process performance parameters 40, for example, where at least one die 20 has a slower switching speed than a switching speed in another die 20. In various embodiments, the process of assembling the design 90 includes creating a model, e.g., a data model, process flow model, logical model, etc. that represents the physical design of 3D IC structure 80. In some cases, the design 90 is stored on a computer-readable storage medium, e.g., within 3D IC design system 28, or in another such medium. In some other embodiments, 3D IC design system 28 can provide the design 90, e.g., to a user 112, a customer, or a third party (e.g., a fabrication entity, or foundry) for formation of 3D IC structure 80 according to design 90. In some cases, 3D IC design system 28 is part of a manufacturing system that forms 3D IC structure 80 according to design 90.

Process P5: assign a back bias voltage 100A, 100B, 100C to each die 20 in the set of dies based upon the performance requirements 60 of the customer design 70 and the reference table 50 (e.g., from which wafer lot 30A, 30B, 30C does die 20 originate?) indicating the process performance parameter 40 for the die 20. FIG. 3 illustrates an example whereby dies 20 with two distinct process performance parameters 40X and 40Y (where dies 20 are from distinct wafer lots 30A and 30B) are assigned distinct back bias voltages (BBV) 100A, 100B. It is understood that the performance parameters 40X, 40Y, etc. that are inserted in the ECID 10 defines the speed of the die 20 (e.g., fast, slow, nominal, etc.). As long as a die 20 passes the performance and reliability tests (meaning it can be used in an assembly), an appropriate back-bias voltage can be applied to that die 20 to meet particular performance requirements 60 of the customer design 70. As noted herein, the processes according to various embodiments can remove the need to sort dies 20 by performance parameters. However, these processes could also be used in conjunction with conventional performance normalization techniques.

According to various embodiments, as shown in FIG. 1, an optional pre-process (Process P0) can include obtaining the process performance parameter 40 for each of the plurality of distinct wafer lots 30A, 30B, 30C and recording the process performance parameter 40 in each ECID 10. This process can be performed prior to process P1, and can include obtaining or otherwise detecting process performance parameters 40 (as noted herein) for each of the distinct wafer lots 30A, 30B, 30C. This can include obtaining test data for wafer lots 30A, 30B, 30C, such as speed test data, voltage drop data, etc., or obtaining similarly categorized design data for wafer lots 30A, 30B, 30C. In any case, in various embodiments, 3D IC design system 28 can obtain process performance parameters 40 and record those parameters 40 in each ECID 10.

It is understood that in the flow diagrams shown and described herein, other processes may be performed while not being shown, and the order of processes can be rearranged according to various embodiments. Additionally, intermediate processes may be performed between one or more described processes. The flow of processes shown and described herein is not to be construed as limiting of the various embodiments.

Returning to FIG. 2, an illustrative environment 101 including 3D IC design system 28, for performing the functions described herein according to various embodiments of the disclosure is shown. To this extent, the environment 101 includes a computer system 102 that can perform one or more processes described herein in order to design a 3D IC (e.g., 3D IC 80, FIG. 4). In particular, the computer system 102 is shown as including the 3D IC design system 28, which makes computer system 102 operable to analyze customer designs (e.g., customer design data 70), reference table 50 and wafer lot data (e.g., ECIDs 10 from wafer lots A, B, C, etc.) by performing any/all of the processes described herein and implementing any/all of the embodiments described herein.

The computer system 102 is shown including a computing device 26, which can include a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the 3D IC design system 28, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human and/or computerized user) 112 to interact with the computer system 102 and/or one or more communications devices to enable the system user 112 to communicate with the computer system 102 using any type of communications link. To this extent, the 3D IC design system 28 can manage a set of interfaces (e.g., graphical user interface(s), application program interface, etc.) that enable human and/or system users 112 (e.g., customers) to interact with the 3D IC design system 28. Further, the 3D IC design system 28 can manage (e.g., store, retrieve, create, manipulate, organize, present, etc.) data, such as customer designs (e.g., customer design data 70), reference table 50 and wafer lot data (e.g., ECIDs 10 from wafer lots A, B, C, etc.) using any solution, e.g., via wireless and/or hardwired means.

In any event, the computer system 102 can comprise one or more general purpose computing articles of manufacture (e.g., computing devices) capable of executing program code, such as the 3D IC design system 28, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the 3D IC design system 28 can be embodied as any combination of system software and/or application software. It is further understood that the 3D IC design system 28 can be implemented in a cloud-based computing environment, where one or more processes are performed at distinct computing devices (e.g., a plurality of computing devices 26), where one or more of those distinct computing devices may contain only some of the components shown and described with respect to the computing device 26 of FIG. 2.

Further, the 3D IC design system 28 can be implemented using a set of modules 132. In this case, a module 132 can enable the computer system 102 to perform a set of tasks used by the 3D IC design system 28, and can be separately developed and/or implemented apart from other portions of the 3D IC design system 28. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of 3D IC design system 28 fixed thereon (e.g., one or more modules 132). However, it is understood that the computer system 102 and 3D IC design system 28 are only representative of various possible equivalent computer systems that may perform a process described herein. To this extent, in other embodiments, the functionality provided by the computer system 102 and 3D IC design system 28 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices 26, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

While shown and described herein as methods, systems and computer program products for designing a 3D IC (e.g., 3D IC 80), it is understood that aspects of the invention further provide various alternative embodiments. For example, in one embodiment, the invention provides a computer program fixed in at least one computer-readable medium, which when executed, enables a computer system to design a 3D IC (e.g., 3D IC 80). To this extent, the computer-readable medium includes program code, such as the 3D IC design system 28 (FIG. 2), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the 3D IC design system 28 (FIG. 2), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of designing a 3D IC (e.g., 3D IC 80). In this case, a computer system, such as the computer system 102 (FIG. 2), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

In any case, the technical effect of the various embodiments of the invention, including, e.g., the 3D IC design system 28, is to design a 3D IC (e.g., 3D IC 80). It is understood that according to various embodiments, the 3D IC design system 28 could be implemented to design a plurality of 3D ICs, as described herein. As described herein, 3D IC design system 28 can help to enhance the reliability of manufacturing 3D IC devices, as well as improve the performance of such devices, when compared with conventional systems and approaches. In addition to parameters described herein 3D IC design system 28 may also consider parameters such as activity factor, power-on hours and/or tolerance for defects (e.g., if there is a functional redundancy) in analyzing one or more customer designs.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A system comprising:
   at least one computing device configured to design a three-dimensional (3D) integrated circuit (IC) structure by performing actions including:
   read an electronic chip identification (ECID) for each of a plurality of dies formed from a plurality of distinct wafer lots, the ECID indicating a process performance parameter for each of the plurality of distinct wafer lots;
   create a reference table mapping a back-bias voltage to be applied to each of the plurality of dies to the process performance parameter for each of the plurality of distinct wafer lots;
   determine performance requirements of a customer design for the 3D IC structure;
   assemble the design of the 3D IC structure including a set of dies selected from at least two of the plurality of distinct wafer lots; and
   assign a back bias voltage to each die in the set of dies based upon the performance requirements of the customer design and the reference table indicating the process performance parameter for the die, the back bias voltage to be applied to each die in the 3D IC structure based on the customer design.

2. The system of claim 1, wherein the at least one computing device is further configured to obtain the process performance parameter for each of the plurality of distinct wafer lots and record the process performance parameter in each ECID.

3. The system of claim 1, wherein the assembling includes creating a model of the 3D IC and storing the model in a computer-readable storage medium.

4. The system of claim 1, wherein the plurality of dies are each formed on fully depleted silicon-on-insulator (FDSOI) substrates.

5. The system of claim 1, wherein the performance requirements of the customer design include at least one of a processing speed of the 3D IC structure, a voltage of the 3D IC structure, an operating temperature of the 3D IC structure, a frequency of the 3D IC structure or a nominal current leakage of the 3D IC structure.

6. The system of claim 1, wherein the 3D IC structure including the set of dies selected from the at least two of the plurality of distinct wafer lots include dies having distinct process performance parameters.

7. The system of claim 6, wherein at least one die has a slower switching speed than a switching speed in another die in the set of dies.

8. A computer program product comprising program code stored on a non-transitory computer-readable medium, which when executed by at least one computing device, causes the at least one computing device to design a three-dimensional (3D) integrated circuit (IC) structure by performing actions including:
   read an electronic chip identification (ECID) for each of a plurality of dies formed from a plurality of distinct wafer lots, the ECID indicating a process performance parameter for each of the plurality of distinct wafer lots;
   create a reference table mapping a back-bias voltage to be applied to each of the plurality of dies to the process performance parameter for each of the plurality of distinct wafer lots;
   determine performance requirements of a customer design for the 3D IC structure;
   assemble the design of the 3D IC structure including a set of dies selected from at least two of the plurality of distinct wafer lots; and
   assign a back bias voltage to each die in the set of dies based upon the performance requirements of the customer design and the reference table indicating the process performance parameter for the die, the back bias voltage to be applied to each die in the 3D IC structure based on the customer design.

9. The computer program product of claim 8, wherein the program code, when executed by the at least one computing device is further configured to obtain the process performance parameter for each of the plurality of distinct wafer lots and record the process performance parameter in each ECID.

10. The computer program product of claim 9, wherein the assembling includes creating a model of the 3D IC and storing the model in a distinct non-transitory computer-readable medium.

11. The computer program product of claim 9, wherein the plurality of dies are each formed on fully depleted silicon-on-insulator (FDSOI) substrates.

12. The computer program product of claim 9, wherein the performance requirements of the customer design include at least one of a processing speed of the 3D IC structure, a voltage of the 3D IC structure, an operating temperature of the 3D IC structure, a frequency of the 3D IC structure or a nominal current leakage of the 3D IC structure.

13. The computer program product of claim 9, wherein the 3D IC structure including the set of dies selected from the at least two of the plurality of distinct wafer lots include dies having distinct process performance parameters.

14. The computer program product of claim 13, wherein at least one die has a slower switching speed than a switching speed in another die in the set of dies.

15. A computer-implemented method of designing a three-dimensional (3D) integrated circuit (IC) structure, performed on at least one computing device, the method comprising:
   reading an electronic chip identification (ECID) for each of a plurality of dies formed from a plurality of distinct wafer lots, the ECID indicating a process performance parameter for each of the plurality of distinct wafer lots;
   creating a reference table mapping a back-bias voltage to be applied to each of the plurality of dies to the process performance parameter for each of the plurality of distinct wafer lots;
   determining performance requirements of a customer design for the 3D IC structure;
   assembling the design of the 3D IC structure including a set of dies selected from at least two of the plurality of distinct wafer lots; and
   assigning a back bias voltage to each die in the set of dies based upon the performance requirements of the customer design and the reference table indicating the process performance parameter for the die, the back bias voltage to be applied to each die in the 3D IC structure based on the customer design.

16. The computer-implemented method of claim 15, further comprising obtaining the process performance parameter for each of the plurality of distinct wafer lots and record the process performance parameter in each ECID.

17. The computer-implemented method of claim 15, wherein the assembling includes creating a model of the 3D IC and storing the model in a computer-readable storage medium.

18. The computer-implemented method of claim 15, wherein the plurality of dies are each formed on fully depleted silicon-on-insulator (FDSOI) substrates.

19. The computer-implemented method of claim 15, wherein the performance requirements of the customer design include at least one of a processing speed of the 3D IC structure, a voltage of the 3D IC structure, an operating temperature of the 3D IC structure, a frequency of the 3D IC structure or a nominal current leakage of the 3D IC structure.

20. The computer-implemented method of claim 15, wherein the 3D IC structure including the set of dies selected from the at least two of the plurality of distinct wafer lots include dies having distinct process performance parameters, wherein at least one die has a slower switching speed than a switching speed in another die in the set of dies.

* * * * *